(12) United States Patent
Mabuchi et al.

(10) Patent No.: US 7,545,411 B2
(45) Date of Patent: Jun. 9, 2009

(54) SOLID-STATE IMAGE PICKUP APPARATUS, ITS DRIVING METHOD, AND CAMERA SYSTEM

(75) Inventors: Keiji Mabuchi, Kanagawa (JP); Koichi Shiono, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/341,104

(22) Filed: Jan. 27, 2006

(65) Prior Publication Data

US 2006/0119722 A1      Jun. 8, 2006

Related U.S. Application Data

(63) Continuation of application No. 09/834,431, filed on Apr. 13, 2001, now Pat. No. 6,992,706.

(30) Foreign Application Priority Data

Apr. 13, 2000  (JP) .............................. 2000-111494

(51) Int. Cl.
    *H04N 5/225*   (2006.01)
(52) U.S. Cl. ..................... 348/220.1; 348/294; 348/273
(58) Field of Classification Search ........................ None
    See application file for complete search history.

(56) References Cited

U.S. PATENT DOCUMENTS

| | | | | |
|---|---|---|---|---|
| 5,262,871 A | * | 11/1993 | Wilder et al. | ................. 348/307 |
| 5,493,335 A | * | 2/1996 | Parulski et al. | ............. 348/231.6 |
| 5,494,335 A | | 2/1996 | Parulski et al. | |
| 5,828,406 A | * | 10/1998 | Parulski et al. | ............. 348/220.1 |
| 6,124,888 A | | 9/2000 | Terada et al. | |
| 6,130,420 A | * | 10/2000 | Tanaka et al. | ............. 250/208.1 |
| 6,204,879 B1 | * | 3/2001 | Koseki et al. | ............. 348/230.1 |
| 6,348,929 B1 | * | 2/2002 | Acharya et al. | .............. 345/660 |
| 6,441,849 B1 | | 8/2002 | Fukuda | |
| 6,661,451 B1 | | 12/2003 | Kijima et al. | |

FOREIGN PATENT DOCUMENTS

JP         02-007680         1/1990

(Continued)

OTHER PUBLICATIONS

Patent Abstracts of Japan, vol. 2000, No. 4, Aug. 31, 2000 JP 2000 023046 Matsushita Electric Ind. Co. Ltd., Jan. 21, 2000.

(Continued)

*Primary Examiner*—Sinh Tran
*Assistant Examiner*—Yogesh Aggarwal
(74) *Attorney, Agent, or Firm*—Robert J. Depke; Rockey, Depke & Lyons, LLC.

(57) ABSTRACT

There is used an XY address type solid-state image pickup element (for example, a MOS type image sensor) in which two rows and two columns are made a unit, and color filters having a color coding of repetition of the unit (repetition of two verticals (two horizontals) are arranged, and when a thinning-out read mode is specified, a clock frequency of a system is changed to 1/9, and on the basis of the changed clock frequency, a pixel is selected every three pixels in both a row direction and a column direction to successively read out a pixel signal.

2 Claims, 6 Drawing Sheets

FOREIGN PATENT DOCUMENTS

| | | |
|---|---|---|
| JP | HEI 02-007680 | 1/1990 |
| JP | 05-122574 | 5/1993 |
| JP | HEI 05-122574 | 5/1993 |
| JP | 07-264606 | 10/1995 |
| JP | HEI 07-264606 | 10/1995 |
| JP | 09-247543 | 9/1997 |
| JP | 09-247689 | 9/1997 |
| JP | HEI 09-247543 | 9/1997 |
| JP | HEI 09-247689 | 9/1997 |
| JP | 10-304250 | 11/1998 |
| JP | HEI 10-304250 | 11/1998 |
| JP | 11-103407 | 4/1999 |
| JP | HEI 11-103407 | 4/1999 |
| JP | 2000-032480 | 1/2000 |

OTHER PUBLICATIONS

Patent Abstracts of Japan, vol. 1998, No. 1, Jan. 30, 1998 JP 09 247689 Olympus Optical Co., Ltd., Sep. 19, 1997.

Patent Abstracts of Japan, vol. 1999 No. 1, Jan. 29, 1999 JP 10 285476 Olympus Optical Co., Ltd., Oct. 23, 1998.

* cited by examiner

SOLID-STATE IMAGE PICKUP APPARATUS, ITS DRIVING METHOD, AND CAMERA SYSTEM

The subject matter of application Ser. No. 09/834,431, is incorporated herein by reference. The present application is a continuation of U.S. application Ser. No. 09/834,431, filed Apr. 13, 2001, now U.S. Pat. No. 6,992,706 which claims priority to Japanese Patent Application No. JP2000-111494, filed Apr. 13, 2000. The present application claims priority to these previously filed applications.

RELATED APPLICATION DATA

The present invention claims priority to Japanese Application No. P2000-111494, filed Apr. 13, 2000,, which application is incorporated herein by reference to the extent permitted by law.

BACKGROUND OF THE INVENTION

1. Field of the Invention

The present invention relates to a solid-state image pickup apparatus, its driving method, and a camera system, and particularly to a solid-state image pickup apparatus using an XY address type solid-state image pickup element typified by a MOS type image sensor, its driving method, and a camera system using an XY address type solid-state image pickup element as an image pickup device, such as a digital still camera.

2. Description of the Related Art

In an image pickup technique of a still picture typified by a digital still camera, a solid-state image pickup element including a large number of pixels is used as an image pickup device, and pixel information of all pixels is independently read out so that a still picture is obtained. For example, in the digital still camera, since a still picture taken by releasing the shutter is required to have high fineness, a solid-state image pickup element including more pixels is used.

On the other hand, before a still picture is taken, in general, an operation of confirming (monitoring) an object is carried out by projecting a motion picture (image of the object) on, for example, a liquid crystal monitor of a small screen. At the stage (monitoring mode) in which the object is confirmed, a rough image (image of low resolution) corresponding to the number of pixels of the liquid crystal monitor is satisfactory.

Besides, in the image transmission for a potable equipment such as a digital still camera, a data rate of transmission is limited. Accordingly, with respect to a still picture, pixel information of all pixels is transmitted to obtain an image of high fineness, and with respect to a motion picture, pixel information is thinned out to decrease the amount of information and is transmitted.

Hitherto, as an image pickup device for a single chip imager color camera, it has been general to use a charge transfer type solid-state image pickup element, for example, a CCD (Charge Coupled Device) type image sensor. On the other hand, in recent years, an XY address type solid-state image pickup element, which is more advantageous than the CCD type image sensor in view of reduction in consumed electric power and miniaturization of a system, for example, a MOS type image sensor, has come into use.

Incidentally, in the single chip imager color camera, in the thinning-out processing of pixel information in the case where the CCD type image sensor is used as the image pickup device, for example, a method has been adopted in which after pixel information for all pixels is read out from the image sensor, the pixel information is thinned out by an external signal processing system. Also in the color camera using, for example, the MOS type image sensor as the image pickup device, the thinning-out read method in the CCD type image sensor has been adopted.

The reason why the thinning-out read method has been adopted like this, in which the pixel information is thinned out by the external signal processing system after the pixel information for all pixels is read out from the image sensor, is as follows:

The reason is as follows: (1) it has been impossible to thin out the pixel information while the spatial arrangement of colors of color filters and the output sequence are held, (2) pixels are sequentially selected by a normal shift register used as selection means for selecting the pixels, (3) the CCD type image sensor has been able to read out signal charges from the pixels only in sequence, and so on.

As an example, when a case where pixel information is thinned out every other pixel is considered, if there is no color difference, the amount of information can be compressed by half in each of lengthwise (vertical) and lateral (horizontal) directions. However, as shown in FIG. 9, in the case where there is a color difference between respective pixels, if pixel information is thinned out every other pixel, pixel information is read out from only pixels of oblique line portions, and only pixel information of, for example, B (blue) can be read out, so that a color image can not be obtained.

From the reason like this, in the single chip imager color camera using the CCD type image sensor or the MOS type image sensor as the image pickup device, after the image information for all pixels is read out from the image sensor, the thinning-out processing of the pixel information has been carried out by the external signal processing system. However, in this case, in spite of the fact that the amount of information is reduced by the thinning-out processing, since a driving frequency of the image sensor is constant, consumed electric power can not be reduced, on the contrary, a load is resultantly applied to a subsequent stage signal processing system.

Especially, in the single chip imager color camera using the MOS type image sensor as the image pickup device, since its superiority over the CCD type image sensor is in the reduction in consumed electric power and the miniaturization of the system as described before, in the case where the amount of pixel information is reduced, if the consumed electric power is reduced without applying a load to the subsequent stage signal processing system in proportion to that, it can be said that the significance is very high.

SUMMARY OF THE INVENTION

The present invention has been made in view of the above problem, and an object thereof is to provide a solid-state image pickup apparatus which enables reduction in consumed electric power without applying a load to a subsequent stage signal processing system in a case where a thinning-out processing of pixel information is carried out, its driving method, and a camera system.

In order to achieve the above object, according to the present invention, an XY address type solid-state image pickup element is used in which color filters having a predetermined color coding are formed for respective pixels arranged in a matrix, and when thinning-out read is specified for the solid-state image pickup element, a clock frequency of a system is changed, and the pixels are selected on the basis of the changed clock frequency and in a sequence corresponding to the color coding to read out pixel signals.

In the XY address type solid-state image pickup element, a pixel at an arbitrary address position can be selected, and its pixel signal can be read out in a unit of a pixel. Then, when the thinning-out read is specified, first, the clock frequency of the system is changed. On the basis of the frequency-changed clock frequency, the pixels are selected in the sequence corresponding to the color coding of the color filters and the pixel signals are read out, so that a thinning-out processing is carried out at the stage where pixel information is read out from the pixels.

DETAILED DESCRIPTION OF THE PREFERRED EMBODIMENTS

Figure 1:
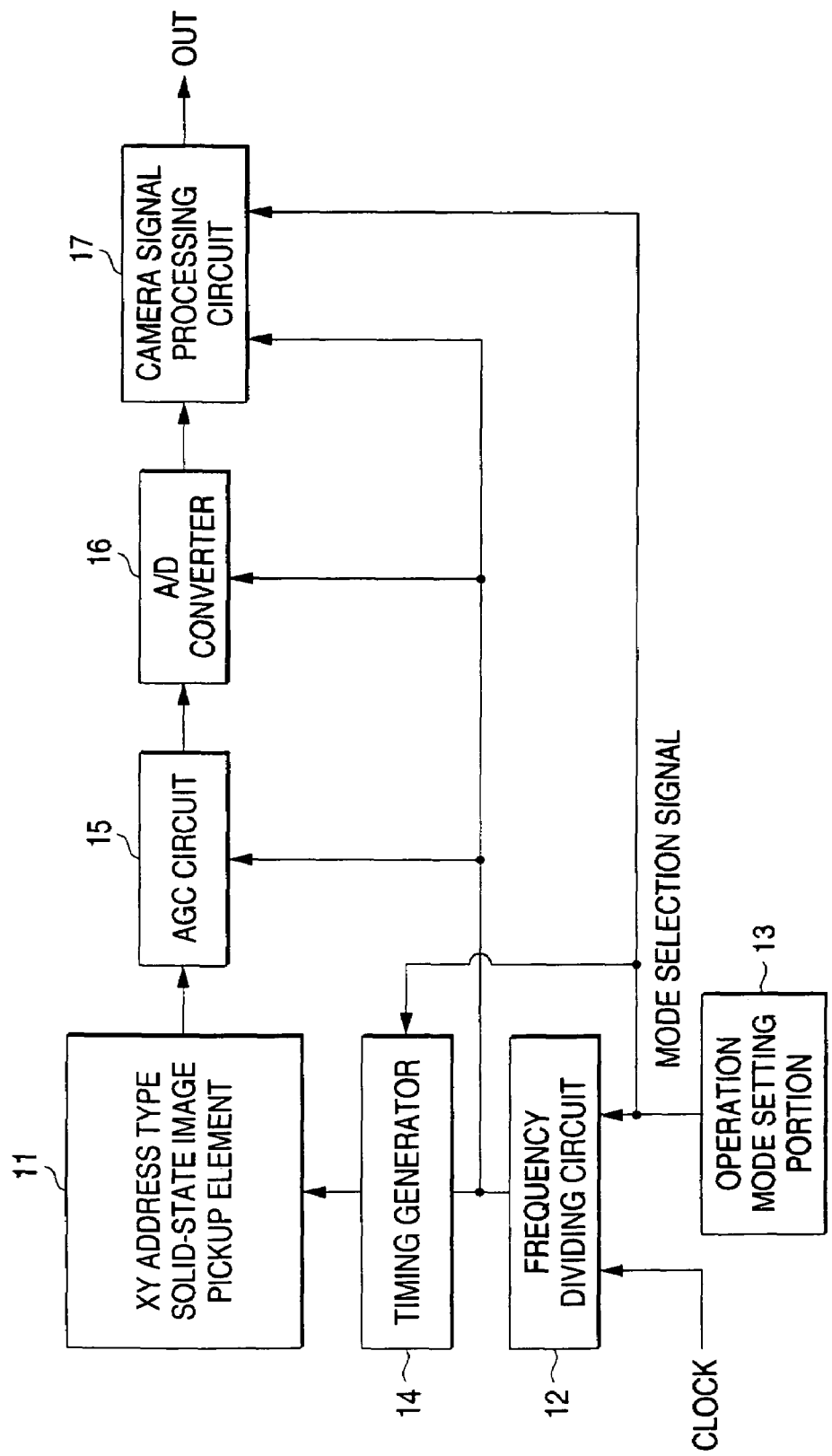
FIG. 1 is a block diagram showing an example of a structure of a camera system to which the present invention is applied.

Hereinafter, embodiments of the present invention will be described in detail with reference to the drawings. FIG. 1 is a block diagram showing an example of a structure of a camera system to which the present invention is applied.

In FIG. 1, in this system, an XY address type solid-state image pickup element 11, for example, a MOS type image sensor is used as an image pickup device. Incident light (image light) from an object forms an image on an image pickup plane of the solid-state image pickup element 11 through an optical system (not shown) including an imaging lens and the like. Besides, a clock which becomes the reference for a system operation is inputted to the system.

This clock, together with a mode selection signal for selecting an operation mode (all-pixel read mode/thinning-out read mode) of the system, is inputted to a frequency dividing circuit 12. The mode selection signal is outputted from an operation mode setting portion 13. The frequency dividing circuit 12 changes the frequency of the inputted clock in accordance with the mode selection signal, and supplies it to a timing generator 14 and a signal processing system of the solid-state image pickup element 11 described later.

On the basis of the clock having the frequency corresponding to the operation mode and inputted from the frequency dividing circuit 12, the timing generator 14 generates various driving pulses necessary for driving the XY address type solid-state image pickup element 11, and supplies the driving pulses to the solid-state image pickup element 11. An AGC (Automatic Gain Control) circuit 15, an A/D (Analog-Digital) converter 16, and a camera signal processing circuit 17 are provided at the subsequent stage of the solid-state image pickup element 11. The clock of the frequency corresponding to the operation mode is supplied from the frequency dividing circuit 12 to these circuits 15, 16 and 17.

The AGC circuit 15 performs an AGC processing for making the signal level of the output signal of the solid-state image pickup element 11 constant. The A/D converter 16 A/D converts the output signal of the AGC circuit 15 and supplies it to the camera signal processing circuit 17. The camera signal processing circuit 17 has a digital signal processing (DSP) structure. A camera signal processing for generating a brightness signal and a color difference signal from inputted image pickup data (image data), and a signal processing such as a detection processing, for example, automatic exposure, automatic focusing, or automatic white balance, are carried out in this camera signal processing circuit 17.

Figure 2:
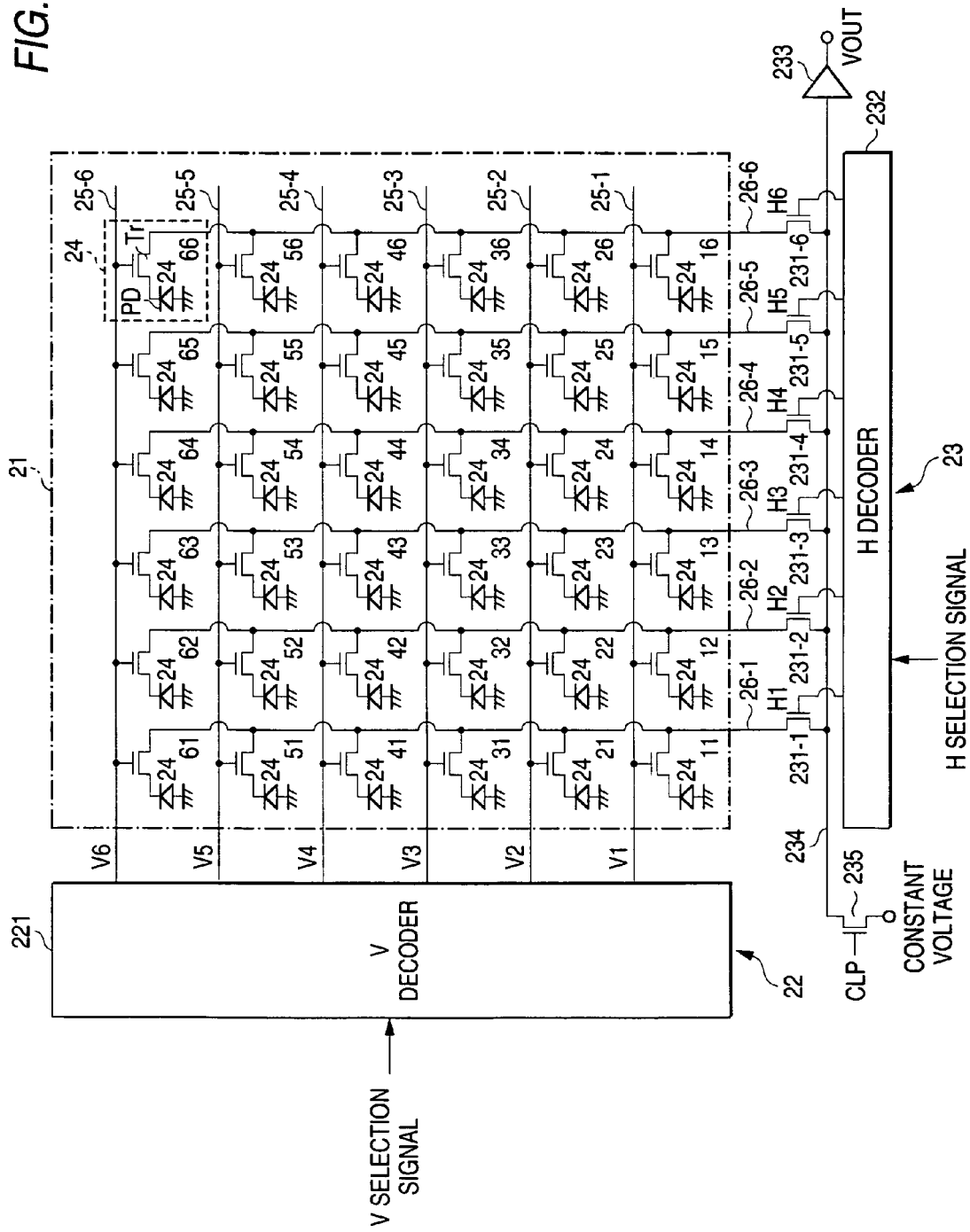
FIG. 2 is a schematic structural view showing an example of a MOS type image sensor.

FIG. 2 is a schematic structural view showing an example of the MOS type image sensor. The MOS type image sensor includes a pixel portion 21, a vertical scanning system 22, and a horizontal scanning system 23.

The pixel portion 21 has a structure in which a number of unit pixels 24 each made of, for example, a photodiode PD and a selection transistor Tr, are arranged in a matrix. Here, for simplification of the drawing, a pixel arrangement of 6, rows and 6, columns is shown. Then, in FIG. 2, an address XY indicating a pixel position is given as a subscript to each of the unit pixels 24. For example, a pixel at a first row and a first column is designated as a pixel 2411.

Vertical selection lines 25-1 to 25-6 and vertical signal lines 26-1 to 26-6 are arranged in a matrix for the respective pixels of the pixel portion 21. Then, control electrodes of the selection transistors Tr in the respective unit pixels 24 are connected to the vertical selection lines 25-1 to 25-6, and output electrodes of the selection transistors Tr are connected to the vertical signal lines 26-1 to 26-6 for every pixel.

The vertical scanning system 22 is constituted by a V (vertical) decoder 221. The V decoder 221 successively outputs row selection pulses V1 to V6 in response to V selection signals inputted from the timing generator 13 of FIG. 1, and applies them to the respective vertical selection lines 25-1 to 25-6.

The horizontal scanning system 23 includes horizontal selection transistors 231-1 to 231-6, a H (horizontal) decoder 232, and an output amplifier 233. The horizontal selection transistors 231-1 to 231-6 are respectively connected between a horizontal signal line 234 and the respective output terminals of the vertical signal lines 26-1 to 26-6. The H decoder 232 successively outputs horizontal selection pulses H1 to H6 in response to H selection signals inputted from the timing generator 13, and gives them to the respective control electrodes of the horizontal selection transistors 231-1 to 231-6.

The output amplifier 233 is connected to one end (output end) of the horizontal signal line 234, and leads a pixel signal, which is successively outputted from the pixel portion 21 through the horizontal selection transistors 231-1 to 231-6 to the horizontal signal line 234, as an output signal VOUT. Incidentally, a clamp transistor 235 is connected to the other end of the horizontal signal line 234. This clamp transistor 235 clamps a potential of the horizontal signal line 234 to a certain fixed voltage (constant voltage) in response to a clamp pulse CLP inputted from the timing generator 13.

Next, in the MOS type image sensor of the above structure, the operation at the time of all-pixel read in which pixel signals of all pixels of the pixel portion 21 are read out, will be described with reference to a timing chart of FIG. 3. Here, there is shown timing relation among the row selection pulses V1, V2, the horizontal selection pulses H1 to H6, the clamp pulse CLP, and the output signal VOUT.

First, when the row selection pulse V1 of high potential is outputted from the V decoder 221 and is applied to the vertical selection line 25-1, signals of the pixels 2411 to 2416 of the first row are respectively read out to the vertical signal lines 26-1 to 26-6. In this state, when the horizontal selection pulse H1 of high potential is outputted from the H decoder 232, the horizontal selection switch 231-1 becomes in an on state. Then, the signal of the pixel 2411 read out to the vertical signal line 26-1 is outputted to the horizontal signal line 234 through the horizontal selection switch 231-1.

At this time, a potential variation corresponding to the signal of the pixel 2411 is generated in the horizontal signal line 234. Then, the potential variation of the horizontal signal line 234 is amplified by the output amplifier 233, and is outputted as the pixel signal of the pixel 2411. Here, when the clamp transistor 235 is turned on in response to the clamp pulse CLP, the horizontal signal line 234 and the vertical signal line 26-1 are reset to a certain constant voltage.

Next, the horizontal selection pulse H1 and the clamp pulse CLP disappear, and instead thereof, when the horizontal selection pulse H2 of high potential is outputted from the H decoder 232, similarly to the case of the pixel 2411, the pixel signal of the pixel 2412 is outputted. Subsequently, this read operation is repeated, so that all pixel signals of the first row from the pixel 2411 to the pixel 2416 are successively read out.

Next, the vertical selection pulse V1 disappears, and instead thereof, when the vertical selection pulse V2 of high potential is outputted from the V decoder 221 and is applied to the vertical selection line 25-2, the respective pixels 2421 to 2426 of the second row are selected. Then, similarly to the first row, the operation of column selection is repeated, and subsequently, the row selection and the column selection are repeated up to the sixth row, so that the pixel signals of all pixels in the pixel portion 21 are successively read out.

It is important in the foregoing all-pixel read operation that if the vertical selection pulses V1 to V6 and the horizontal selection pulses H1 to H6 can be adequately outputted at suitable timing, a pixel signal of an arbitrary pixel can be selectively read out. This means that at the stage of reading out signals from the respective pixels, a thinning-out processing of pixel information can be carried out. Then, here, the structure using the decoders as row selection means and column selection means is adopted to produce the degree of freedom.

Incidentally, in the case of a camera system dealing with color, color filters are provided in pixel units on the pixel portion 21 in, for example, an on-chip manner. Here, as shown in FIG. 4, in a MOS type image sensor carrying filters, as color filters 27, having a primary color coding of repetition of units each having two verticals (two horizontals (two rows and two columns), an operation in a case where a thinning-out read processing for thinning out and reading out pixel information is realized, will be described.

Figure 4:
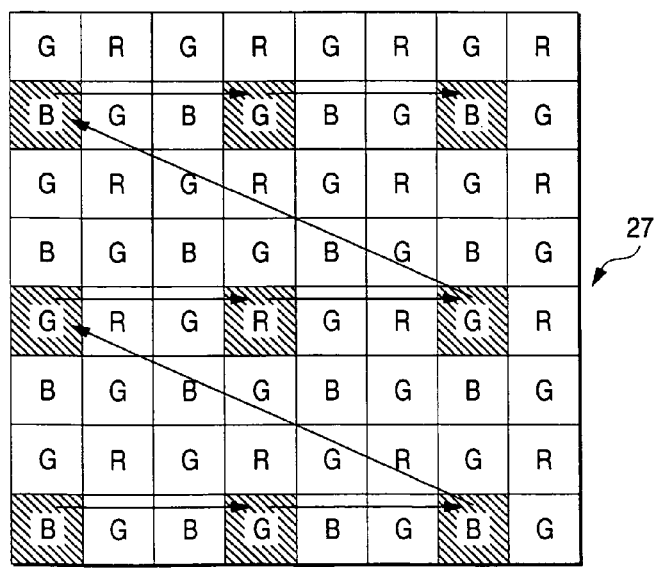
FIG. 4 is a conceptual view for explaining the operation of thinning-out read of a first example.

Like this, in the case where the color filters 27 having the primary color coding of repetition of two verticals (two horizontals are used, as a first example of thinning-out read, as shown by oblique lines in FIG. 4, while two rows and two columns are skipped, that is, every three rows and three columns, a pixel signal is read out for each pixel.

Figure 5:
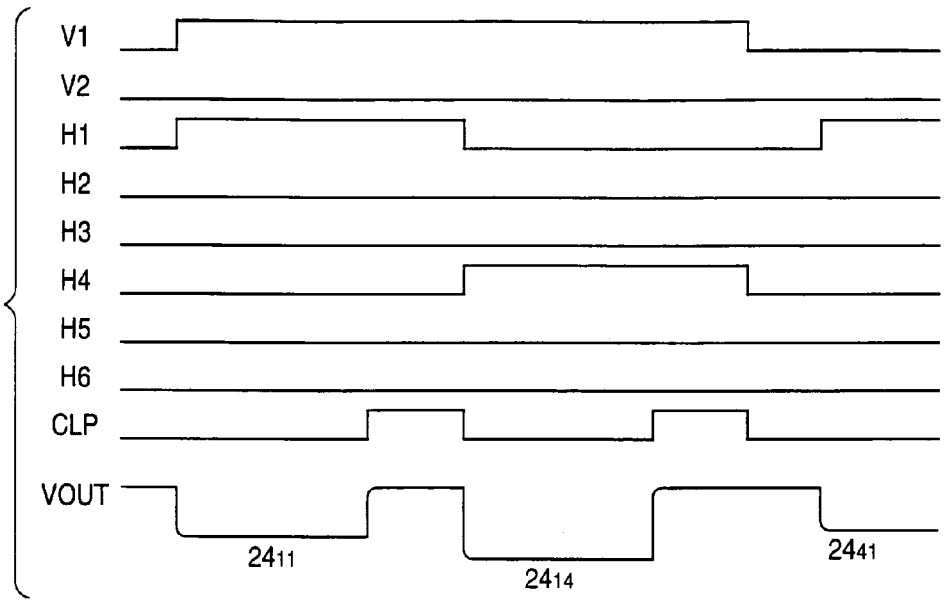
FIG. 5 is a timing chart for explaining the operation of thinning-out read of the first example.

In order to realize this thinning-out read, the frequency dividing circuit 12 of FIG. 1 divides the frequency of the inputted clock by a factor of 9, when the mode selection signal for selecting the thinning-out read mode is given from the operation mode setting portion 13. FIG. 5 shows a timing chart at the time of the thinning-out read.

Figure 3:
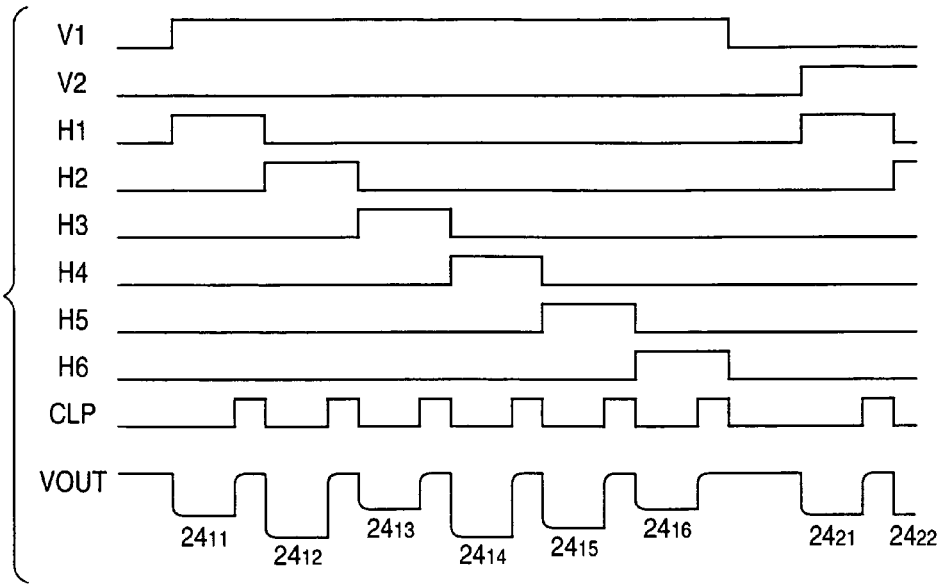
FIG. 3 is a timing chart for explaining the operation of all-pixel read.

Incidentally, the horizontal axis (time axis) of FIG. 5 is different from that of the case of FIG. 3 in scale, and although the actual scale is 9, times larger than the case of FIG. 3, it is depicted in a triple scale from the circumstances of the paper plane. Besides, although FIG. 4 shows the color coding corresponding to the pixel arrangement of eight rows and eight columns, FIG. 5 shows the timing relation corresponding to the pixel arrangement of six rows and six columns of FIG. 2.

In the thinning-out read mode, first, when the row selection pulse V1 of high potential is outputted from the V decoder 221 and is applied to the vertical selection line 25-1, the respective signals of the pixels 2411 to 2416 of the first row are read out to the vertical signal lines 26-1 to 26-6. In this state, when the horizontal selection pulse H1 of high potential is outputted from the H decoder 232, the horizontal selection switch 231-1 becomes in an on state, and the signal of the pixel 2411 is outputted from the vertical signal line 26-1 through the horizontal selection switch 231-1 to the horizontal signal line 234.

At this time, in the horizontal signal line 234, a potential variation corresponding to the signal of the pixel 2411 is generated. Then, the potential variation of the horizontal signal line 234 is amplified by the output amplifier 233, and is outputted as the pixel signal of the pixel 2411. Here, when the clamp transistor 235 is turned on in response to the clamp pulse CLP, the horizontal signal line 234 and the vertical signal line 26-1 are reset to a certain constant voltage.

Next, the horizontal selection pulse H1 and the clamp pulse CLP disappear, and instead thereof, the horizontal selection pulse H4 of high potential is outputted from the H decoder 232. Then, similarly to the case of the pixel 2411, the signal of the pixel 2414 is read out to the vertical signal line 26-4, and is outputted through the horizontal selection transistor 231-4, the horizontal signal line 234, and the output amplifier 233. By this, the respective signals as to the pixels 2412 and 2413 are not read out but are thinned out.

Next, although not shown in the timing chart of FIG. 5, instead of the vertical selection pulse V1, when the vertical selection pulse V4 of high potential is outputted from the V decoder 221 and is applied to vertical selection line 25-4, the pixels 2441 to 2446 of the fourth row are selected. Then, similarly to the first row, the operation of column selection is repeated every three columns, so that the pixel signal is read out for each pixel while two rows and two columns are skipped.

According to the thinning-out read of the first example described above, the following merits are obtained. That is, the amount of pixel information can be compressed by a factor of 9, while both the sequence of the pixel signals and the spatial position relation are the same as the all-pixel read. Further, since it is not necessary to change the sequence of the signal processing system at the subsequent stage, a load is not applied to the signal processing system. Besides, since the clock frequency of the system becomes 1/9, the consumed electric power can also be reduced by a factor of 9. Further, the number of images outputted per second, that is, a frame rate can be made constant.

Subsequently, similarly to the first example, on the assumption that color filters having a color coding of repetition of two verticals (two horizontals are used, a second example and a third example of thinning-out read will be described.

Figure 6:
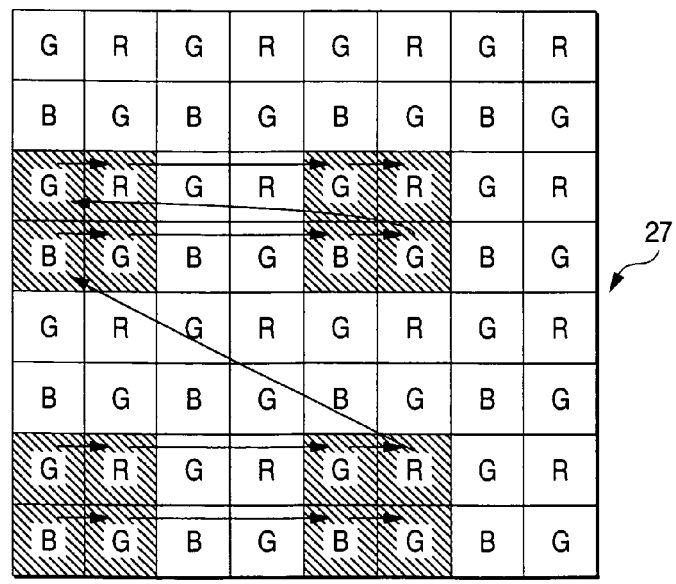
FIG. 6 is a conceptual view for explaining the operation of thinning-out read of a second example.

First, in the thinning-out read of the second example, as shown by oblique lines in FIG. 6, two verticals (two horizontals are made a unit, and a pixel signal is successively read out every other unit in both the row direction and the column direction. Besides, in order to realize the thinning-out read, the clock frequency is divided by a factor of 4, in the frequency dividing circuit 12 of FIG. 1.

According to the thinning-out read of the second example, the following merits are obtained. That is, the amount of pixel information can be compressed by a factor of 4, while the sequence of the pixel signals is kept the same as the all-pixel read. Further, since the sequence of the subsequent stage signal processing system has only to deal with the change of spatial position relation of color, the load of the signal processing system may be made low. Besides, since the clock frequency of the system becomes 1/4, the consumed electric power can also be reduced by a factor of 4, and further, the frame rate can be made constant.

Figure 7:
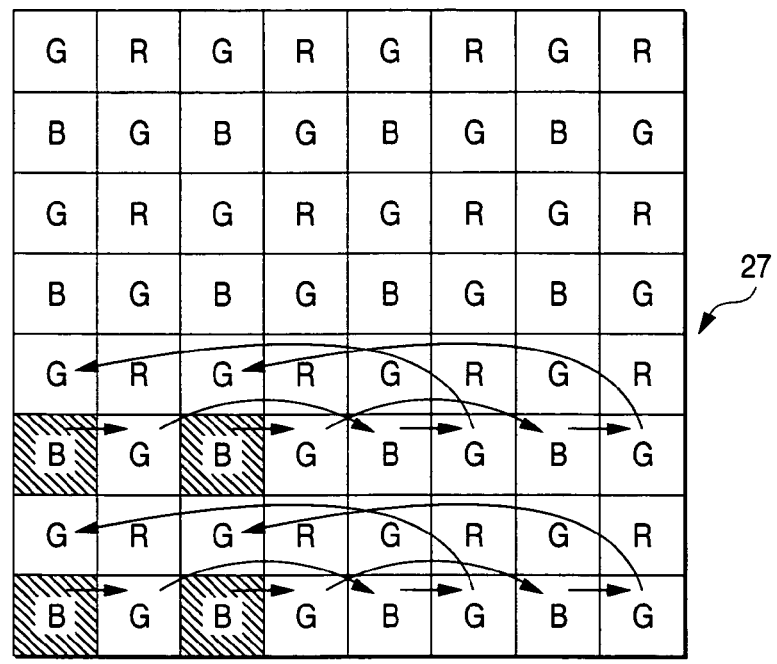
FIG. 7 is a conceptual view for explaining the operation of thinning-out read of a third example.

Next, in the thinning-out read of the third example, two verticals (two horizontals are made a unit, and four (2(2) such units are integrated, and readout is made while an addition signal of lower left pixels in the units, an addition signal of lower right pixels, an addition signal of upper left pixels, and an addition signal of upper right pixels are scanned as shown by arrows in FIG. 7. Besides, in order to realize the thinning-out read, the clock frequency is divided by a factor of 4, in the frequency dividing circuit 12 of FIG. 1.

According to the thinning-out read of the third example, the following merits are obtained. That is, the amount of pixel information can be compressed by a factor of 4, while the sequence of pixel signals is kept the same as the all-pixel read, and the sensitivity becomes 4, times higher by the addition read. Further, since the sequence of the subsequent stage signal processing system has only to deal with the change of the spatial position relation of the centroid of color, the load of the signal processing system may be made low. Incidentally, the spatial position relation of the centroid of color is the same as that of the thinning-out read of the second example. Besides, since the clock frequency of the system becomes 1/4, the consumed electric power can also be reduced by a factor of 4, and further, the frame rate can be made constant.

Figure 8:
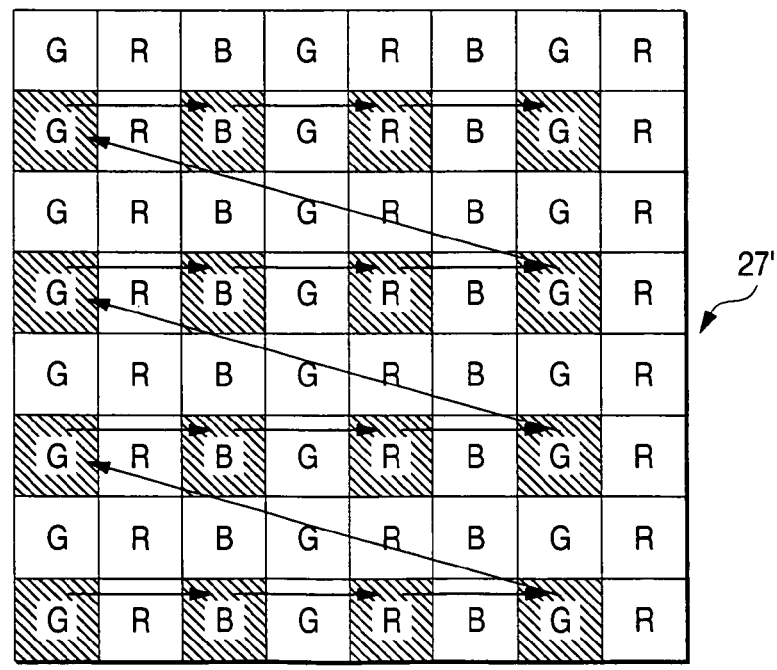
FIG. 8 is a conceptual view for explaining the operation of thinning-out read of a fourth example.
Figure 9:
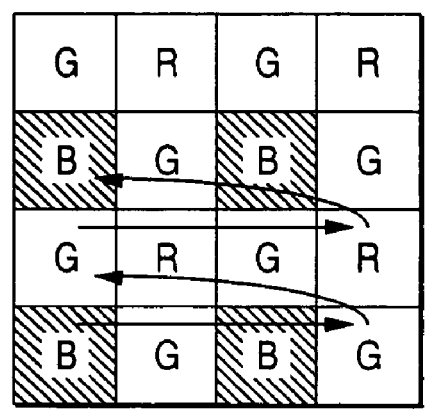
FIG. 9 is a view showing a primary color coding of repetition of two verticals (two horizontals.

FIG. 8 is a view showing a primary color coding of repetition of the same color in the same column and three colors in the row direction. Here, thinning-out read in a case where color filters 27' having this color coding are used, will be described as a fourth example.

In the thinning-out read of the fourth example, as shown by oblique lines in FIG. 8, a pixel signal is read out every other pixel in both the row direction and the column direction. Besides, in order to realize this thinning-out read, the clock frequency is divided by a factor of 4, in the frequency dividing circuit 12 of FIG. 1.

According to the thinning-out read of the fourth example, the following merits are obtained. That is, the amount of pixel information can be compressed by a factor of 4, while both the sequence of pixel signals and the position relation are the same as the all-pixel read except that the definitions of two colors are replaced with each other. Further, in the sequence of the subsequent stage signal processing system, since the definitions of two colors have only to be replaced, the load of the signal processing system may be made low. Besides, since the clock frequency of the system becomes 1/4, the consumed electric power can also be reduced by a factor of 4, and the frame rate can be made constant.

It is important in the foregoing thinning-out read operations of the respective examples that if selection in the vertical direction and the horizontal direction can be adequately made, a pixel signal at an arbitrary position can be selectively read out. Accordingly, the XY address type solid-state image pickup element 11 is not limited to the passive type MOS type image sensor shown in FIG. 2, but any image sensor may be used as long as a row and a column are selected to read out a pixel signal, such as a CMD (Charge Modulation Device) type image sensor wherein pixels are constituted by an MOS transistor or an amplified image sensor.

Incidentally, although the above embodiment adopts the structure using the decoders as selection means of the row and selection means of the column to produce the degree of freedom, in addition to the decoders, it is also possible to adopt the structure using two shift registers for the all-pixel read and for the thinning-out read, and in short, any structure may be adopted as long as the same driving can be performed.

As described above, according to the present invention, when thinning-out read is specified for an XY address type solid-state image pickup element, a clock frequency of a system is changed, and on the basis of the changed clock frequency, pixels are selected in a sequence corresponding to the color coding of color filters to read out pixel signals. Thus, since a thinning-out processing can be carried out at a stage where pixel information is read out from the pixels, the amount of the pixel information can be compressed without applying a load to a signal processing system, while both the sequence of the pixel information and the spatial position relation are kept the same as all-pixel read, and further, consumed electric power can be reduced as the clock frequency of the system is changed, and a frame rate can be made constant even if an operation mode is changed.

What is claimed is:

1. A solid-state image pickup apparatus, comprising:
an XY addressable type solid-state image pickup element in which pixels are arranged in a matrix and color filters are formed at respective pixels and which supports an all-pixel read-out mode and a thinning-out read-out mode;
frequency changing means for reducing a clock frequency of a system to provide a constant frame rate for between when the all-pixel read-out mode is specified for the solid-state image pickup element, and when the thinning-out read mode is specified for the solid-state image pickup element; and
driving means for selecting pixels on the basis of the clock frequency changed by the frequency changing means and in a sequence corresponding to a color coding of both a row direction and a column direction to read out pixel signals,
wherein, in said thinning-out read mode, less than all of the pixels in any single column of said matrix are individually output, and less than all of the pixels in any single row of said matrix are individually output, wherein:
the color coding is repeated in a unit, the unit being pixels represented by the intersection of two adjacent rows and two adjacent columns; and
the driving means successively reads out an addition signal of lower left pixels corresponding to a plurality of the units, an addition signal of lower right pixels corresponding to the plurality of the units, an addition signal of upper left pixels corresponding to the plurality of units, and an addition signal of upper right pixels corresponding to the plurality of units.

2. A method of driving a solid-state image pickup apparatus using an XY addressable type solid-state image pickup element in which pixels are arranged in a matrix, which supports an all-pixel read-out mode and a thinning-out read-out mode, and in which color filters having a predetermined color coding are formed for the respective pixels, comprising the steps of:
reducing a clock frequency for readout and providing a constant frame rate between when the all-pixel read-out mode is specified for the solid-state image pickup element, and when the thinning-out read mode is specified for the solid-state image pickup element; and reading out pixel signals by selecting the pixels on the basis of the changed clock frequency and in a sequence corresponding to the color coding for both a row direction and a column direction, wherein, in said thinning-out read mode, less than all of the pixels in any single column of said matrix are individually read out, and less than all of the pixels in any single row of said matrix are individually read out, wherein:

the color coding is repeated in a unit, the unit being pixels represented by the intersection of two adjacent rows and two adjacent columns; and four pixel signals are integrated, the integration comprising an addition signal of lower left pixels corresponding to the units, an addition signal of lower right pixels corresponding to the units, an addition signal of upper left pixels corresponding to the units, and an addition signal of upper right pixels corresponding to the units.

* * * * *